United States Patent
Hong et al.

(10) Patent No.: US 7,643,979 B2
(45) Date of Patent: Jan. 5, 2010

(54) METHOD TO ANALYZE AN ANALOG CIRCUIT DESIGN WITH A VERIFICATION PROGRAM

(75) Inventors: Qiang Hong, San Jose, CA (US); Kevin D. Jones, Hayward (GB); Paul Wong, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 635 days.

(21) Appl. No.: 11/334,063

(22) Filed: Jan. 17, 2006

(65) Prior Publication Data

US 2007/0168172 A1    Jul. 19, 2007

(51) Int. Cl.
*G06F 17/50*    (2006.01)
*G01R 31/28*    (2006.01)

(52) U.S. Cl. .............................. 703/14; 703/22; 716/5; 702/85; 702/109

(58) Field of Classification Search .................... 703/2, 703/14, 22, 13; 702/85, 109; 716/5
See application file for complete search history.

(56) References Cited

U.S. PATENT DOCUMENTS

| | | | |
|---|---|---|---|
| 5,732,192 A * | 3/1998 | Malin et al. ..................... 703/2 |
| 6,237,706 B1 * | 5/2001 | Karpik et al. .............. 180/9.52 |
| 6,327,545 B1 * | 12/2001 | Browen et al. ................ 702/85 |
| 6,347,388 B1 | 2/2002 | Hollander |
| 6,427,223 B1 | 7/2002 | Kim et al. |
| 6,493,841 B1 | 12/2002 | Kim et al. |
| 6,553,531 B1 | 4/2003 | Kim et al. |
| 6,560,757 B1 * | 5/2003 | Ballam ........................... 716/5 |
| 6,832,182 B1 * | 12/2004 | Wilson, Jr. ................... 703/13 |
| 6,959,271 B1 * | 10/2005 | Ballam ........................ 703/14 |
| 7,216,314 B2 * | 5/2007 | Decloedt ....................... 716/5 |
| 2004/0098215 A1 * | 5/2004 | Gee et al. .................... 702/109 |
| 2005/0144578 A1 * | 6/2005 | Decloedt ....................... 716/5 |

OTHER PUBLICATIONS

Cadence, "Analog/Mixed-Signal Flow the Advanced Custom Design Methodology", White Paper, copyright 2003, 8 pgs.
Knowlent, "Products Overview", copyright 2005, located at "www.knowlent.com/products.shtml", retrieved on Apr. 6, 2006, 3 pgs.

* cited by examiner

*Primary Examiner*—Thai Phan
(74) *Attorney, Agent, or Firm*—Hickman Palermo Truong & Becker LLP

(57) ABSTRACT

Data structures and algorithms are provided to automatically generate an analog stimulus to apply to a simulation of the analog DUT. A constraint solver is provided to determine suitable values to use in the stimulus generation. The suitable values are random values within a range of allowed values. For example, a number of different stimuli are generated for successive application to the analog DUT, each with a different magnitude within a range of allowed magnitudes. Data structures and algorithms are provided to monitor analog electrical properties at nodes of the analog DUT. Data structures and algorithms are provided to define constraints on the analog electrical properties and determine whether the constraints were violated. Data structures and algorithms are provided to define simulation coverage conditions in the analog domain and determine whether the defined analog domain coverage conditions have been satisfied.

32 Claims, 7 Drawing Sheets

METHOD TO ANALYZE AN ANALOG CIRCUIT DESIGN WITH A VERIFICATION PROGRAM

FIELD OF THE INVENTION

The present invention relates to analyzing and verifying a design under test (DUT). More particularly, the present invention relates to analyzing and verifying an analog DUT or a mixed digital/analog DUT using a verification program.

BACKGROUND

As the size of the analog portion of circuits increases it is becoming more challenging to verify the analog design. The difficulty in verification exists whether verifying an analog circuit alone, or a design containing both a digital portion and an analog portion (mixed mode designs). Traditional design verification flows employ different tools and methodologies for analog designs than for digital designs.

Typically, a digital design is verified by employing a hardware description language (HDL), such as Verilog or VHDL (VHSIC hardware description language), and possibly using a Hardware Verification Language (HVL). HDLs are languages that have text-based expressions that can describe temporal behavior and/or circuit structure of an electronic system. For example, a digital design can be described in an HDL using text-based expressions. A simulation program allows the digital design to be simulated by executing the underlying semantics of the expressions written in the HDL language.

A verification program is typically executed along with the simulation of the digital DUT in order to analyze and verify the digital DUT. The verification program can be written in the same HDL that is used to describe the DUT. However, recently HVLs have been developed to aid in the verification of the digital DUT. Among other goals, HVLs are intended to provide programming constructs and capabilities to permit testing a DUT, particularly those DUTs expressed in an HDL, by stimulating certain inputs of the simulation of the digital DUT and monitoring the resulting states of the simulation of the DUT.

In addition to HDLs that are directed towards digital designs, there exist HDLs that are directed towards analog systems (e.g., Verilog-A) and mixed digital/analog systems (e.g., Verilog AMS). However, such analog or mixed mode HDLs do not have the ability to conveniently analyze and verify an analog DUT or a digital/analog DUT.

Typically, the analog portion of the circuit is analyzed and verified with a simulation tool such as SPICE (Simulation Program with Integrated Circuit Emphasis). Currently, there are a number of commercial versions of SPICE. SPICE is able to simulate analog circuits with great accuracy by solving equations that represent electrical behavior of the devices in the circuit. However, due to limitations of the SPICE language, verification of an analog circuit is primarily a manual process, which is tedious and error prone.

For example, SPICE outputs log files containing simulation results. However, it is very tedious for the user to look through the log files. In order to test the circuit under different conditions, a first SPICE simulation is executed with one set of parameters that are input by hand. Then, the parameters are changed by hand and a new simulation is executed.

A minimal amount of automation can be achieved by the user writing script programs that drive a SPICE simulation. For example, the user can write a script program that allows a very limited number of different input signals to be applied to the SPICE simulation. This allows the simulation to step through a limited number of voltage values. However, the input parameters that are changed are typically limited to changing the voltage source from 1.0 volt to 1.1 volt, etc. However, script programs are not convenient for specifying more complex combinations and variations of input parameters to a SPICE simulation.

Because of the vastly different techniques between analyzing the digital and the analog portions of the design, analog and digital simulations are often executed completely independent from each other. Unfortunately, using independent simulations for the two portions of the design can result in inaccuracies. In recent years, tools have emerged that co-simulate by using an HDL simulator for the digital portion and a SPICE simulator for the analog portion. These tools help solve some problems that arise from using two independent simulations. However, even with such a mixed mode co-simulation, analysis and verification of the analog portion is still a tedious and error prone process.

Thus, analyzing an analog DUT is tedious and error prone regardless of whether only the analog portion is being analyzed or whether the digital and analog portions of the design are being analyzed together. Therefore, there is a need for more efficient and accurate techniques for analyzing and verifying an analog circuit design. There is a need for a technique that functions with a simulation of analog circuit design by itself or a co-simulation of an analog design with a circuit digital design.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
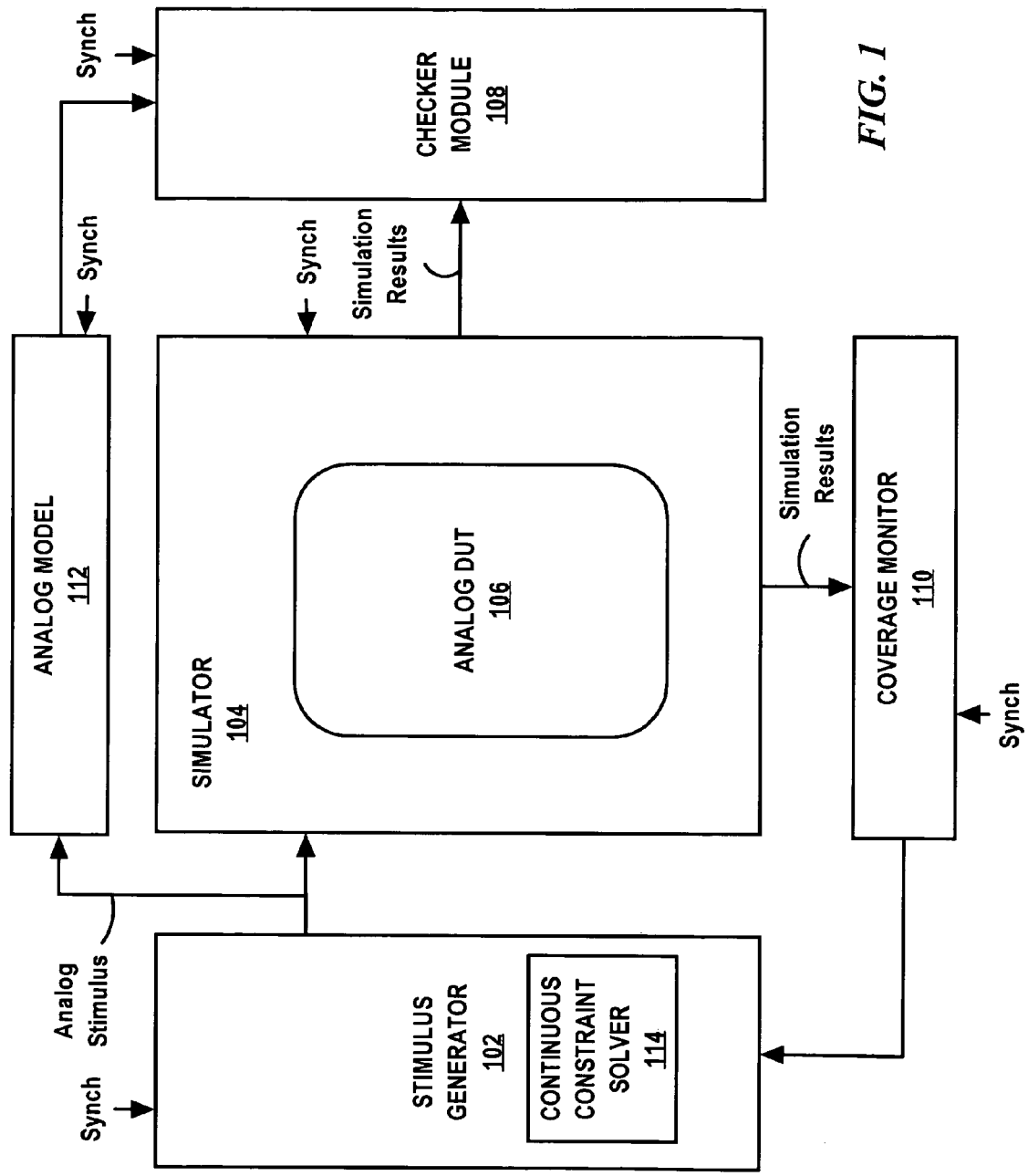
FIG. 1 is a diagram illustrating an environment for analyzing and verifying an analog design under test (DUT), in accordance with an embodiment of the present invention.

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

Overview

The present invention provides data structures and associated algorithms that may be used to analyze and verify an analog device under test (DUT). In one embodiment, the data structures and associated algorithms are an extension to a high level verification language. Typical capabilities of high level verification languages are the ability to generate a variety of stimuli to apply to a simulation of a DUT, monitor the simulation for occurrence of conditions, and track what simulation conditions were covered when the stimuli were applied to the simulation of the DUT. HVLs may also have the ability to determine what expected simulation results should be, given the applied stimuli. The monitoring for conditions can include determining whether simulation results comply with the expected simulation results.

Data structures and algorithms are provided to automatically generate an analog stimulus to apply to a simulation of the analog DUT, in accordance with an embodiment of the present invention. A constraint solver is provided to determine suitable values to use in the stimulus generation, in accordance with an embodiment of the present invention. The suitable values are random values within a range of allowed values, in one embodiment. For example, a different stimulus is generated for each successive simulation run of the analog DUT. Each stimulus has a different magnitude within a range of allowed magnitudes.

Data structures and algorithms are provided to monitor analog electrical properties at nodes of the analog DUT, in accordance with an embodiment of the present invention. Data structures and algorithms are provided to define constraints on the analog electrical properties and determine whether the constraints were violated, in accordance with an embodiment of the present invention. Data structures and algorithms are provided to define simulation coverage conditions in the analog domain and determine whether the defined analog domain coverage conditions have been satisfied, in accordance with an embodiment of the present invention.

One embodiment of the present invention is a method of using a verification program to analyze an analog device under test. The method includes at least the following steps. A verification program is executed, wherein execution of the verification program generates a stimulus that represents a signal of an analog source that is defined in the verification program. The stimulus is applied to a simulation of an electronic circuit to generate at least one simulation result. The simulation result is provided to the verification program. The verification program performs at least one of: checking whether the simulation result complies with an expected simulation result; checking whether an electrical property, based on the simulation result, has a value that violates a constraint on the electrical property specified in the verification program; and determining whether the simulation resulted in occurrence of a specified simulation condition specified in the verification program.

Another embodiment in accordance with the present invention is a method of simulating a circuit that includes an analog portion. Such a circuit may be entirely analog, or may be mixed mode. The method includes executing a verification program, wherein the verification program includes a definition of data type. The definition specifies one or more attributes. Execution of the verification program causes instantiation of a data structure based on the definition, wherein the data structure has fields that correspond to the attributes specified by the definition. During simulation of the circuit, a value of an electrical property associated with the analog portion is determined, and at least one of the following is performed: a) the value of the electrical property is assigned to a field of the data structure; b) a value from a field of the data structure is read to determine a constraint on the value of the electrical property; and an indication of a violation is generated if the value of the electrical property violates the constraint; and c) a value is read from a field of the data structure to determine a set of one or more coverage conditions; if it is detected that the value of the electrical property corresponds to a coverage condition within the set of one or more coverage conditions, then an indication that the coverage condition has been satisfied is stored.

Environment for Analyzing and Verifying an Analog DUT

FIG. 1 is a diagram illustrating an environment for analyzing and verifying an analog design under test (DUT), in accordance with an embodiment of the present invention. A simulator 104 executes a simulation of the analog device under test 106. A verification program comprises a stimulus generator 102, a checker module 108, a coverage monitor 110, and a model 112 of the analog DUT. The verification program may be implemented in a high level verification language. A high level verification language, as defined herein, is a language that has the capability to generate stimuli to apply to the DUT according to constraint bounding values, calculate expected simulation values based on the applied stimuli, and determine what simulation conditions were covered.

The Simulator

The simulator 104 may be any simulator that simulates continuous time conditions. The simulator 104 may execute a functional simulation or a behavioral simulation. The analog DUT 106 may be described at the transistor-level, the RTL-level, the gate-level or another level. The simulator 104 may be implemented based on a version of the SPICE language, wherein the analog DUT 106 may be a SPICE netlist. The simulator 104 may be implemented based on an HDL, wherein the analog DUT 106 may be described in the HDL. Suitable HDLs in which to describe the analog DUT 106 include, but are not limited to, Verilog-A, Verilog-AMS, and VHDL-AMS.

The Stimulus Generator

The stimulus generator 102 is able to generate a stimulus to input to the simulator 104. The stimulus generator 102 has a constraint solver 114, in accordance with one embodiment. The stimulus generator 102 is adapted to provide a stimulus with a format that is suitable for the simulator 104. The stimulus generator 102 outputs a piece-wise linear representation of an analog signal, in accordance with one embodiment. Simulators such as those based on the SPICE language are able to input piece-wise linear signals and perform a simulation based thereon. For example, a simulator based on SPICE could perform a transient analysis on each of the steps in the piece-wise linear representation of the analog signal.

However, the stimulus does not have to be piece-wise linear. Furthermore, the stimulus can be applied to an HDL simulation of the analog DUT 106 rather than a SPICE based simulation.

The stimulus generator 102 outputs a stimulus by passing parameters describing the analog stimulus to the simulator 104, in accordance with one embodiment. Those parameters could include attributes such as the form of the stimulus (e.g., sinusoidal, triangle, square, exponential, etc.), magnitude, and frequency. Other parameters may be passed as well. With a waveform described as such, a simulation based on the SPICE language could perform an AC analysis or a DC analysis, in addition to a transient analysis.

The Constraint Solver

The constraint solver 114 inputs a set of one or more constraints that define permissible values in the analog domain. The constraint solver 114 determines one or more acceptable values from within the analog domain. Those values are used to generate the stimulus that is applied to the analog DUT 106.

For example, the constraints may be that the peak-to-peak voltage of the stimulus must be 3.3 volts or less and that electrical components of the analog DUT 106 should be simulated at a temperature between 0 to 100 degrees Celsius. Given these constrains, the constraint solver may determine a peak-to-peak voltage of 2.7 Volts and a temperature of 37 degrees Celsius for a first simulation run. Thus, a stimulus with a peak-to-peak value of 2.7 Volts is provided to the simulator 104. The temperature is also provided to the simulator 104, such that the analog DUT 106 can be simulated at that temperature. After executing the first simulation run, the process is repeated with the constraint solver determining a new peak-to-peak voltage and a new temperature, which are applied to the simulator 104.

The voltage and temperature can be determined pseudo-randomly or randomly. In one embodiment, a software pseudo-random number generator is used for pseudo-random number generation. In one embodiment, a hardware random number generator is used for random number generation.

The constraint solver is capable of solving complex constraint problems. For example, the allowable voltage values can be a function of temperature. As a specific example of a more complex constraint, if the temperature is in a first temperature range, then the voltage is constrained to a first voltage range, but if the temperature is in a second temperature range, then the voltage is constrained to a second voltage range.

The Model

The model 112 is an abstract representation of the analog DUT 106. The model 112 is described in a high level verification language, in accordance with one embodiment. The model 112 receives the same stimulus that is input to the simulator 104 and is able to generate expected simulation values based on the stimulus. For example, the high level verification language is able to model electrical components, wherein the analog DUT 106 can be simulated using the high level verification language at a high abstraction level that still provides valid results. A given expected simulation result can have a range of values, as the result relates to a continuous time simulation. For example, the model 112 can determine that a voltage at a given node of the analog DUT 106 is expected to fall within a certain range, given the stimulus. The expected simulation results can be based on other factors such as temperature.

The Checker Module

The checker module 108 receives the expected results from the model 112 and actual simulation results from the simulator 104. Based thereon, the checker module 108 determines whether the simulation results comply with the expected results. Therefore, the checker module 108 determines whether the simulation results fall within a range of values specified by the model output.

The checker module 108 can also determine whether simulation results comply with a condition or constraint that is defined in the verification program. For example, the verification program can have defined therein a data structure that describes a constraint on an electrical property simulated in the analog DUT 106. If the checker module 108 detects the constraint has been violated, then the checker module 108 indicates the violation has occurred. As a particular example, the verification program can have defined therein a data structure that describes a voltage overshoot condition for a node of the analog DUT 106. The checker module 108 determines whether the voltage overshoot condition occurred at the node, based on simulation results.

The Coverage Monitor

The coverage monitor 110 tracks conditions that have occurred during execution of the simulation of the analog DUT 106. Because the simulation results pertain to the analog domain, it is not practical to cover every possible simulation condition. For example, the voltage at a particular node could have a range of permissible values. It is not practical to determine whether simulation causes each and every voltage in a given range to occur at that node.

Therefore, a coverage space can be defined. For example, a coverage space may be defined as a voltage range. However, the coverage space can include multiple variables. For example, the space may include a voltage range and a temperature range. Adequate coverage can be defined as any desired pattern within the coverage space. For example, adequate coverage might be at least one point near each boundary of the coverage space and a number of points in-between. Adequate coverage might be defined as a single point in the coverage space.

The coverage conditions are specified in the verification program. For example, execution of the verification program causes instantiation of data structures that define coverage conditions. A coverage condition may be satisfied if an electrical property is anywhere in a range defined in the coverage data structure. The coverage monitor reads the coverage conditions from the instantiated data structures and compares them with simulation results to determine if the coverage conditions are met. The coverage monitor then records which coverage conditions have been satisfied.

A report from the coverage monitor is provided to the stimulus generator 102, wherein the stimulus generator 102 is able to generate suitable analog stimuli to obtain adequate coverage in the analog domain.

Interfaces and Synchronization Signals

In one embodiment, the verification program interfaces with the analog DUT to obtain details about the configuration of the analog DUT 106 and parameter values. For example, the verification program accesses, from the simulator 104, a netlist that describes the analog DUT 106. As another example, the verification program accesses an HDL description of the analog DUT 106.

A synchronization signal can be input to the various components to help synchronize the activities of the simulator 104 with the verification program components (stimulus generator 102, model 112, checker 108, and coverage monitor 110).

Analog Source Object Type

Table I illustrates an object type that defines an analog source, in accordance with an embodiment of the present invention. Based on the definition, a data structure may be instantiated in a verification program and used in a process of generating a stimulus to apply to an analog simulation, in accordance with an embodiment of the present invention. The analog source could be an analog voltage source or an analog current source. The data structure has one or more attributes that define properties of the analog source. With any given instance of the object type some of the attributes may have null values.

TABLE I

ANALOG SOURCE

Source Type (Voltage/Current)
DC Magnitude
AC waveform (sawtooth, pulse, sinusoidal)
AC Phase
AC Magnitude
Bounding constraints (Range)
Noise (white Gaussian noise, fixed frequency noise, coupling noise)
Predefined waveform
Output impedance The source type attribute is used to specify whether the analog source is a current source or a voltage source.

The DC magnitude attribute is used to specify a DC magnitude value for the analog source.

The AC waveform attribute is used to specify the shape of the AC waveform for the analog source. Values for the AC waveform include, but are not limited to, sinusoidal, sawtooth, and pulse.

The AC magnitude is used to specify the magnitude of the AC waveform. The magnitude may be a peak-to-peak magnitude, although this is not required.

The AC phase specifies a relative phase of the AC waveform. By specifying a different AC phase in two different analog sources, the AC phase attribute can be used to define a relationship between the two analog sources. Optionally, the analog source can have an attribute that specifies a time parameter that specifies a time delay between a first and second analog source.

The bounding constraint is used to specify one or more constraints that can be imposed on values for the analog source. For example, there may be a range constraint, which could be a voltage range or a current range. The range can be used to specify a range relative to the AC magnitude or the DC magnitude. For example, if the AC magnitude is defined as 3.3. Volts, and the range is defined as (−0.5 Volts, +0.3 Volts), then the constraint generator determines a voltage value that is between 2.8 to 3.6 Volts. The range can be used instead of the AC magnitude, wherein the constraint generator determines an AC magnitude that is within the specified range. The range can be used instead of the DC magnitude, wherein the constraint generator determines a DC magnitude that is within the range. The constraint generator can determine different values for the analog source for different simulation runs.

The noise attribute is used to specify noise to superimpose on the analog source. The noise can include, but is not limited to, white Gaussian noise, fixed frequency noise, coupling noise. A function can be called to determine suitable values for the noise.

The pre-defined waveform attribute is used to specify some pre-defined waveform. For example, the user can provide a file that defines a waveform. Alternatively, the verification program can access a library of pre-defined waveforms.

The output impedance is used to specify an output impedance for the analog source, which the stimulus generator factors in when generating a stimulus that represents the analog source.

These listed attributes are for illustrative purposes. An analog source object can have many other attributes, and may not have some of the above-listed attributes. There can be an entire family of object types for analog sources.

Monitoring Object Type

Table II illustrates a monitoring object type that defines aspects of monitoring an analog portion of a simulation, in accordance with an embodiment of the present invention. Based on the monitoring object type, a data structure may be instantiated during execution of a verification program in order to monitor the analog simulation, in accordance with an embodiment of the present invention. Moreover, the monitoring object type has attributes that can be used to specify constraints on electrical properties and simulation coverage conditions.

TABLE II

MONITOR

Location attribute
Electrical Property attribute (output voltage swing, output impedance, rise and fall time, voltage ringing, phase, phase margin, voltage gain, current gain, power dissipation, jitter analysis, auto correlation)
Pointer attribute for storing pointer to simulation results
Value attribute for storing electrical property value
Constraint attribute category
Coverage condition attribute category The location attribute is used to specify what a location in the analog portion of the simulation to be monitored. For example, the location may be specified in an instantiated data structure as one or more nodes in the analog simulation.

The electrical property attribute is used to specify which electrical property is to be monitored at the node or nodes. The electrical property attribute can specify output voltage swing, output impedance, rise and fall time, voltage ringing, phase, phase margin, voltage gain, current gain, power dissipation, jitter analysis, auto correlation. Many other electrical properties can be specified, as well.

The pointer attribute is used to specify a location at which simulation results are stored. For example, when the verification program monitors an electrical property such as rise time, the verification program stores, at a location indicated by the pointer, a value for the voltage at given node for each of a plurality of times. Alternatively, the simulation results can be stored in the monitoring data structure.

The value attribute is used to store a value for the electrical property, once determined by the verification program. The value can be taken directly from the simulation results or derived by the verification program by analyzing one or more simulation results. For example, the analog simulator might provide a value for output impedance. The verification program stores this value in the value field of a monitoring data structure. The verification program might calculate an output voltage swing based on an analysis of a number of simulation results and store this value in the value field. Thus, the verification program has supporting algorithms to determine the value for the electrical property based on simulation results, in accordance with one embodiment.

The constraint attribute category generally represents attributes for storing constraint criteria. The constraint criteria may be specified relative to an electrical property. The verification program has algorithms that detect whether the constraint was violated and provide an indication of the violation. An example of a constraint attribute is a maximum voltage attribute, which corresponds to a field in the instantiated data structure that specifies a maximum voltage. As a particular example, the constraint could be used to determine whether a voltage at a specified node crosses a threshold, wherein the constraint specifies the threshold.

The monitoring object type can be used to detect a constraint violation as follows. During simulation, the verification program instantiates a data structure for monitoring. The location to be monitored (the node), the electrical property (voltage), and the constraint on the electrical property (threshold) are read from the instantiated data structure. The verification program has algorithms that detect whether the voltage at the node crosses the threshold. If so, the verification program provides an indication of the constraint violation.

The coverage attribute category generally represents attributes for specifying coverage conditions. The coverage conditions are in the analog domain. An example of a coverage attribute is whether the voltage at a given node is within a range of voltages. The monitoring object type can be used to determine coverage conditions as follows. During simulation, the verification program reads a value from an instantiation of a monitoring data structure that specifies one or more coverage conditions. The verification program has supporting algorithms to determine whether the value of an electrical property of the simulation corresponds to a coverage condition within the set of one or more coverage conditions. If so, the verification program stores an indication that the coverage condition has been satisfied.

Event Object Type

The monitoring object type is just one example of an object type that is used in analyzing and verifying an analog DUT. It is not required that the monitoring object type have all of the attributes in the example. For example, the constraint and/or coverage attributes could be specified in separate object types. Table III illustrates an object type for defining analog event detection, in accordance with an embodiment of the present invention. The event detection object type could be used by itself for event detection in the analog domain, or used in conjunction with a monitoring object type.

The event object can be used to define more than one event. Furthermore, one of the attributes can be a combination of events. For example, a sequence of the events can be defined, wherein the verification program monitors for occurrence of that sequence.

TABLE III

| ANALOG EVENT |
|---|
| Event definition 1 |
| Event definition 2 |
| ... |

TABLE III-continued

| ANALOG EVENT |
|---|
| Event definition n |
| Combination of events |

Based on the event object type, a data structure may be instantiated in a verification program and used in a process of detecting an event in an analog simulation, in accordance with an embodiment of the present invention. For example, the analog event may be whether a signal at a node in the analog DUT crosses a threshold value. During simulation of the analog DUT, a value is determined for an electrical property associated with the analog simulation. For example, if the event to be detected is whether a voltage at a node crosses a threshold, then the electrical property would be the voltage at that node. During simulation, a value from a field of the event data structure is read to determine a constraint on the value of the electrical property. For example, the value might define the threshold voltage, continuing with the example of the voltage at the node crossing the threshold. Thus, the threshold is a constraint on the voltage, in this example. There are a multitude of different constraints that can be applied to electrical properties associated with the analog portion of the simulation.

The verification program has supporting algorithms to determine whether a constraint associated with the electrical property is violated, in accordance with one embodiment. Further, the verification program has supporting algorithms to generate an indication that the constraint has been violated if the value of the electrical property in the simulation violates the constraint.

Coverage Object Type

Table IV illustrates an object type for defining one or more coverage conditions in accordance with an embodiment of the present invention. Based on the coverage object type, a data structure may be instantiated in a verification program and used in a process of detecting a coverage condition in an analog simulation, in accordance with an embodiment of the present invention. The coverage conditions are in the analog domain. The verification program reads a value from the data structure to determine one or more coverage conditions. The coverage conditions may relate to at least one electrical property of the analog DUT. For example, the coverage condition may be a range of voltage values at a node in the analog DUT. The verification program has supporting algorithms to determine whether one whether the value of the electrical property of the analog DUT corresponds to a coverage condition within the set of one or more coverage conditions. If so, an indication is stored that the coverage condition has been satisfied. The coverage object type could be used by itself, or used in conjunction with a monitoring object type.

TABLE IV

| COVERAGE |
|---|
| Coverage Condition Definition |

Device Object Type

Table V illustrates an object type that defines a device, in accordance with an embodiment of the present invention. Based on the device object type, a data structure may be instantiated in a verification program, in accordance with an embodiment of the present invention. For example, an instantiation of the device object type can be used in the model 112 of FIG. 1. Alternatively, the device object type can be used for monitoring purposes.

TABLE V

| DEVICE |
| --- |
| Device Definition Attribute Category |
| Constraint attribute category |

The device definition attribute category generally relates to attributes used to describe the device. Many different types of devices could be described. The attributes for each device object type can be specific to the device. An example of a device definition attribute is a transistor type attribute, which could specify whether the transistor is a bipolar type of device or a field effect type of device. Values for these attributes might be obtained from a netlist.

The constraint attribute category generally relates to attributes used to describe constraints on the device. The constraints can be read from an instantiated device data structure by the verification program. Based on the constraint, the verification program determines if the device violates the constraint. A particular example of a constraint attribute is "operating region," which pertains to the operating region of a transistor. For example, the operation region attribute could have values such as "linear" and "saturation." The verification program can determine whether the transistor is operating in the specified region and store in indication of this. For example, the verification program obtains voltage values for the transistor terminals and applies well known equations to determine the operating region of the transistor.

The device object type could have many other attributes. In one embodiment, attributes related to coverage conditions are included in a device object type.

General Flows Applying Analog Stimulus to Anolog Simulation

Figure 2:
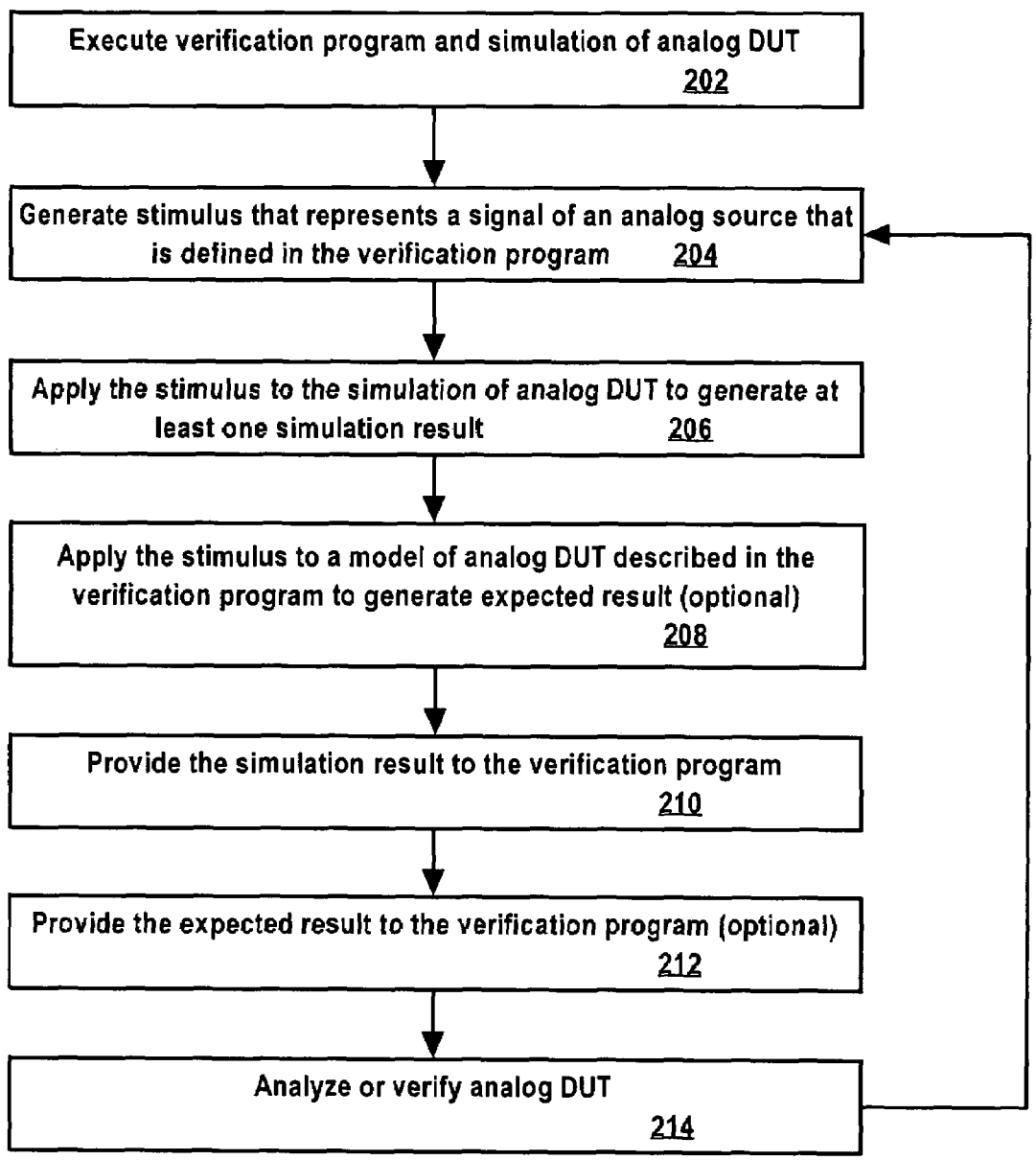
FIG. 2 is a flowchart illustrating a process of stimulating an analog simulation, in accordance with an embodiment of the present invention.

FIG. 2 is a flowchart illustrating a process 200 of stimulating an analog simulation, in accordance with an embodiment of the present invention. In step 202, a verification program and a simulation of an analog DUT are executed.

In step 204, a stimulus is generated that represents a signal of an analog source that is defined in the verification program. For example, execution of the verification program causes instantiation of a data structure having attributes describing an analog source. An example of an analog source object type upon which such a data structure is based is provided herein, although process 200 is not limited to the example analog source object type. Based on the attributes defined in the data structure, the verification program generates the stimulus.

One of the attributes may be a range. For example, this could be a voltage or current range. The verification program determines the magnitude of the stimulus by determining a value within the range. The value can be randomly determined.

As previously discussed, the data structure for the analog source can have many other attributes. For example, one of the attributes can define a relationship between the analog source and another source that is defined in the verification program using the high level verification language. One of the attributes may specify a noise. In this case, the step of generating a stimulus includes generating noise values representing the specified noise and incorporating the noise values into the stimulus. Still another of the attributes may be one or more bounding constraints. In this case, the step of generating a stimulus includes solving a constraint problem to determine values to assign to the stimulus.

In step 206, the stimulus is applied to a simulation of at least a portion of an electronic circuit to generate at least one simulation result. For example, the stimulus is applied to a simulation of an analog DUT in a simulation that has only the analog DUT. Alternatively, the stimulus is applied to an analog portion of a DUT in a co-simulation that also includes a digital portion of the DUT.

In optional step 208, the stimulus is applied to a model of the analog portion of the DUT to generate at least one expected simulation result. The model is described in a high level verification language, in accordance with one embodiment. The high level verification language can also be used to write the verification program.

In step 210, the simulation result is provided to the checker module in verification program. In optional step 212, the expected simulation result is provided to the checker module in the verification program.

In step 214, the verification program analyzes or verifies the analog DUT, based on the simulation result. Step 214 can include checking whether the simulation result complies with the expected simulation result. However, step 214 can include other verification and analysis. Step 214 can include checking whether an electrical property, based on the simulation result, has a value that violates a constraint on the electrical property specified in the verification program. The constraint can be specified in a data structure in the verification program. Step 214 can include determining whether the simulation resulted in occurrence of a specified simulation condition specified in the verification program. Checking for occurrence of specified simulation conditions allows monitoring for simulation coverage.

The process 200 then returns to step 204, wherein a new stimulus is generated. When generating the new stimulus, a new value within the range can be determined. Thus, the verification program can repeatedly determine new values within the range and generate stimuli based thereon. The values are random values, in accordance with one embodiment.

Monitoring an Analog Simulation

Figure 3A:
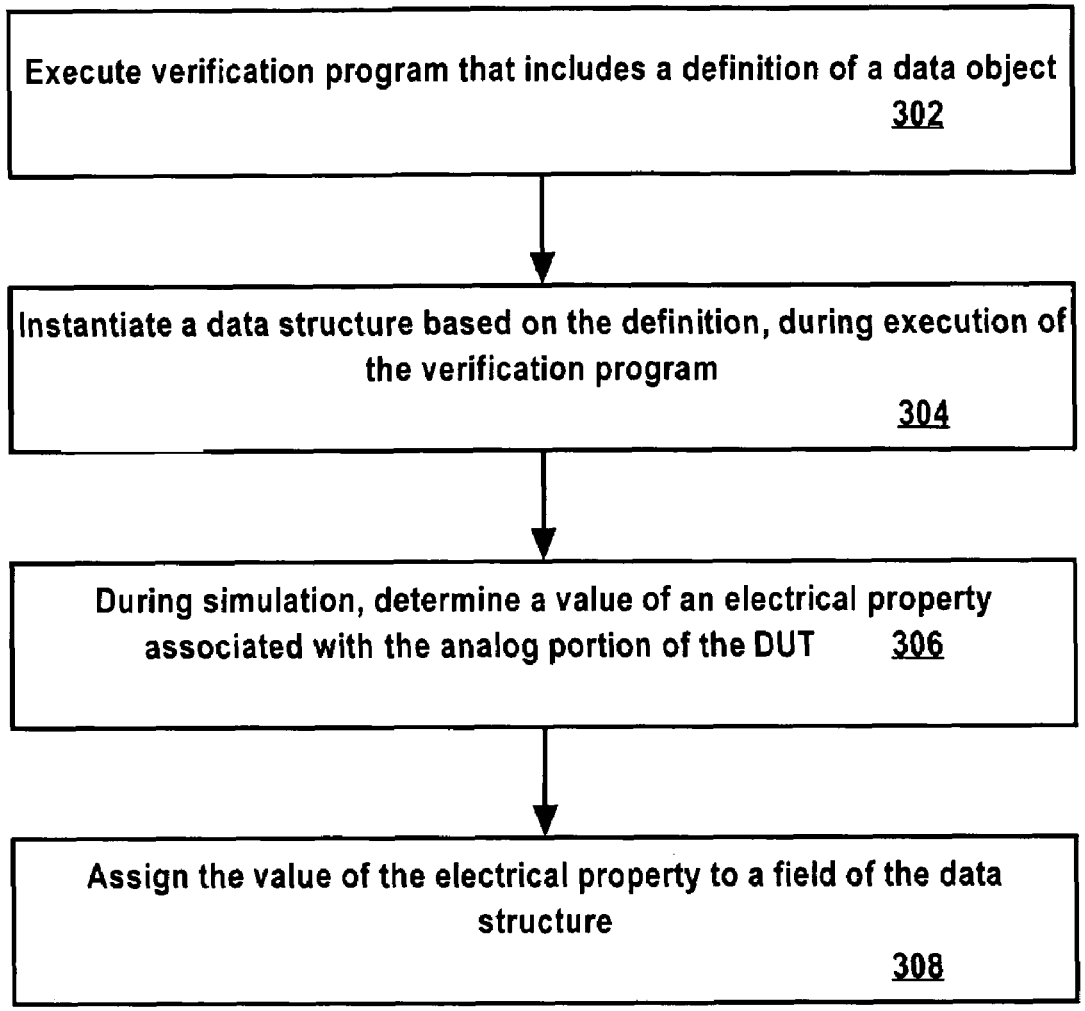
FIG. 3A is a flowchart illustrating monitoring a simulation of a circuit that includes an analog portion, in accordance with an embodiment of the present invention.

FIG. 3A is a flowchart illustrating monitoring a simulation of a circuit that includes an analog portion, in accordance with an embodiment of the present invention. Step 302 is executing a verification program. The verification program includes a definition of data object. The data object can have an attribute that specifies an electrical property. As one example, the definition of the data object may be an object that defines attributes suitable to monitor an output voltage swing in an analog DUT.

Step 304 is instantiation of a data structure based on the definition, wherein the data structure has fields that correspond to the attributes specified by the definition. For example, a data structure can be instantiated with fields that specify one or more nodes to monitor and an electrical property to be monitored. However, a different type of data structure could be instantiated.

Step 306 is determining a value of an electrical property associated with the analog portion. The electrical property can be a result that comes directly from the simulation or a value that is determined based on one or more simulation results. For example, a value of the electrical property can be the value of a voltage at a node in the simulation. The value of the electrical property might be the output voltage swing, which might be determined by analyzing multiple simulation results. Thus, the value of the electrical property may be determined by a verification program applying a set of rules to one or more simulation results.

Step 308 is assigning the value of the electrical property to a field of the data structure. For example, a value the represents the output voltage swing is assigned to the data structure. The data structure can also be assigned a voltage value that came directly from the simulation.

Detection a Constraint Violation in an Analog Simulation

Figure 3B:
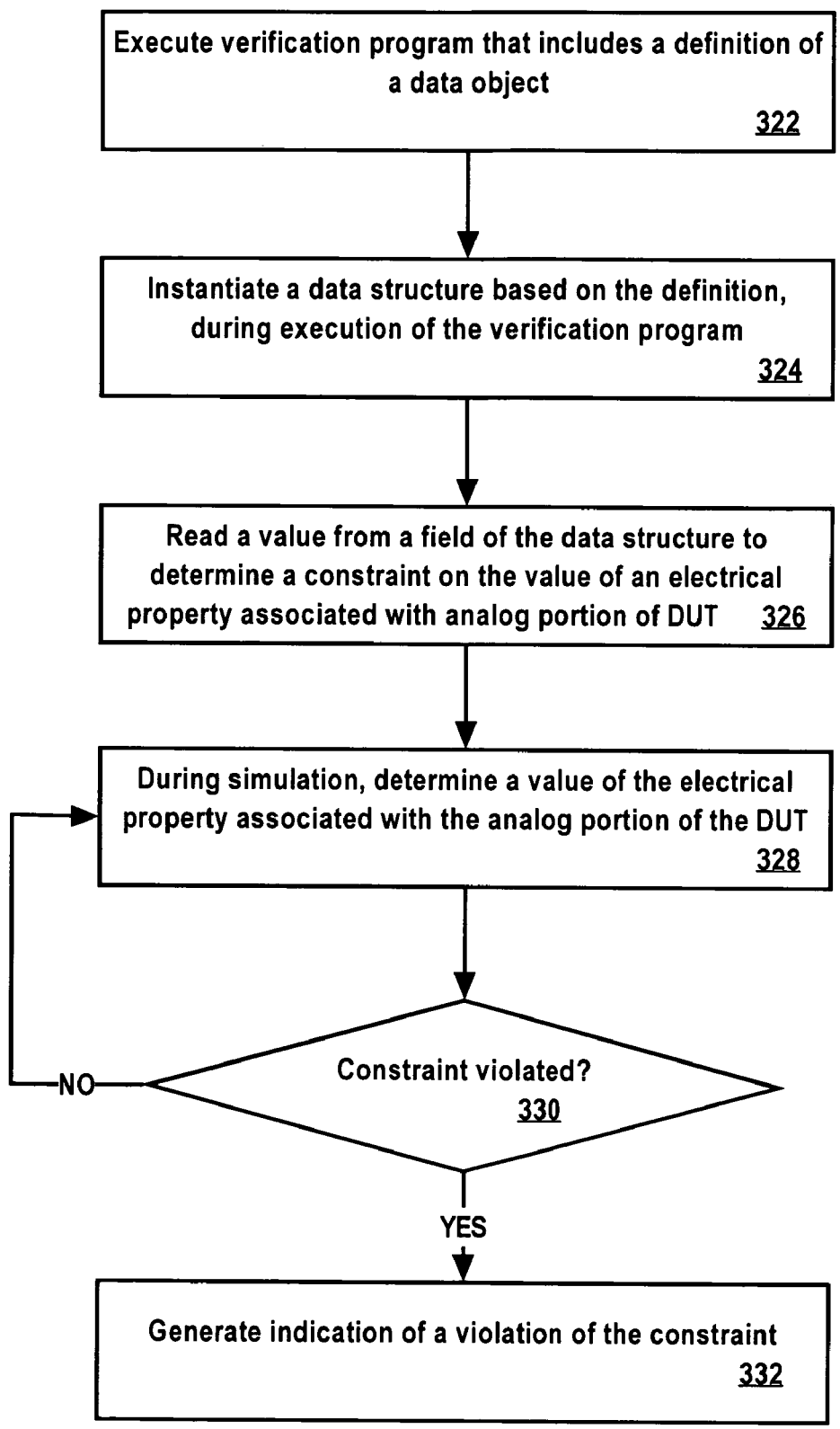
FIG. 3B is a flowchart illustrating determining a constraint violation in a simulation of a circuit that includes an analog portion, in accordance with an embodiment of the present invention.

FIG. 3B is a flowchart illustrating determining whether a constraint was violated in a simulation of a circuit that includes an analog portion, in accordance with an embodiment of the present invention. Step 322 is executing a verification program. The verification program includes a definition of data object. As one example, the data object may define attributes suitable to facilitate detection whether the voltage at a given node in a simulation exceeds a threshold value (constraint). As another example, the data object may define attributes suitable to facilitate detecting if a transistor in a simulation is operating in the saturation region.

Step 324 is instantiation of a data structure based on the definition, wherein the data structure has fields that correspond to the attributes specified by the definition. For example, a data structure based on a monitoring object type similar to the monitoring object type described herein is instantiated. A data structure based on an object type similar to the event object type described herein could also be instantiated instead. Also, multiple data structures could be instantiated. For example, a separate data structure for monitoring and for event detection could be instantiated. Other types of data structures than those described herein could be instantiated, as well. For example, a data structure based on an object type similar to the device object type described herein could be instantiated.

Step 326 is reading a value from a field of the data structure to determine a constraint on the value of an electrical property. For example, the constraint may be a maximum allowable voltage at a node in the analog DUT. As another example, the constraint may be a transistor operating in the saturation region.

Step 328 is determining a value of the electrical property associated with the analog portion. The electrical property can be a result that comes directly from the simulation. For example, a value of the electrical property can be the value of a voltage at a node in the simulation. However, the value of the electrical property could also be determined by applying a set of rules to one or more simulation results.

Step 330 is determining if the constraint is violated. For example, the verification program determines whether a voltage at a given node exceeds a threshold value. Using the example of the transistor operating in the saturation region, the verification program obtains the values for voltages at the transistor's terminals and applies well-known equations to determine if the transistor is operating in the saturation region.

If the constraint is determined to have been violated then, in Step 332, an indication of the violation is generated. If the constraint was determined to have not been violated, then control returns to step 328 to determine another value for the electrical property, if more values are possible.

Determining Coverage in an Analog Simulation

Figure 3C:
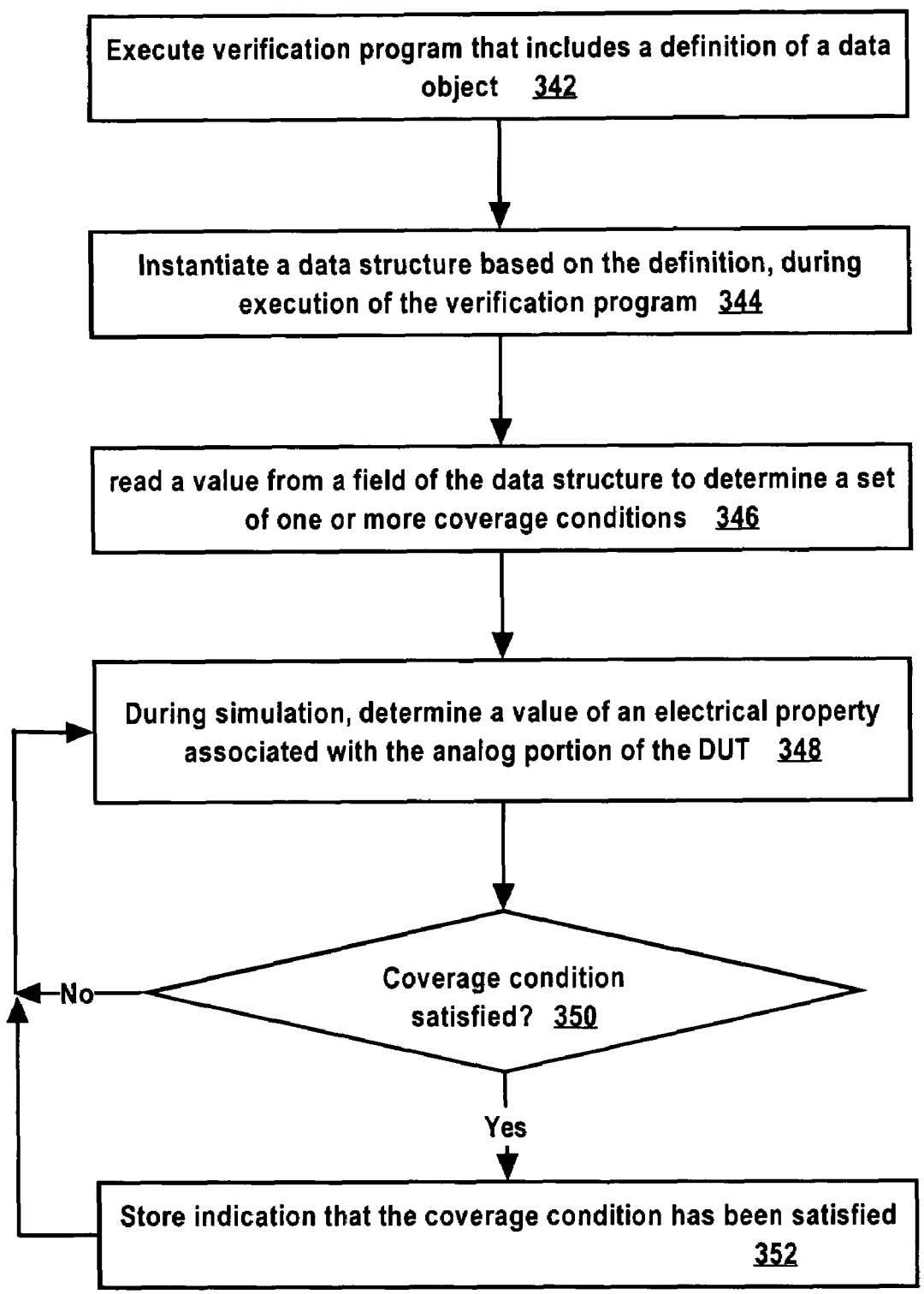
FIG. 3C is a flowchart illustrating determining coverage in a simulation of a circuit that includes an analog portion, in accordance with an embodiment of the present invention.

FIG. 3C is a flowchart illustrating determining coverage in a simulation of a circuit that includes an analog portion, in accordance with an embodiment of the present invention. Step 342 is executing a verification program. The verification program includes a definition of data object. As one example, the definition of the data object may be an object that defines attributes suitable to determine what simulation conditions have be covered in a simulation of an analog DUT.

Step 344 is instantiation of a data structure based on the definition, wherein the data structure has fields that correspond to the attributes specified by the definition. For example, a data structure based on a monitoring object type similar to the monitoring object type described herein is instantiated. A data structure based on an object type similar to the coverage object type described herein could be instantiated instead. Also, multiple data structures could be instantiated. For example, a separate data structure for monitoring and for coverage could be instantiated. Other types of data structures than those described herein could be instantiated, as well.

Step 346 is reading a value from a field of the data structure to determine a set of one or more coverage conditions. For example, the coverage conditions might specify a voltage range at a given node and a temperature range at which at least a portion of the circuit was simulated.

Step 348 is determining a value of an electrical property associated with the analog portion. The electrical property can be a result that comes directly from the simulation. For example, a value of the electrical property can be the value of a voltage at a node in the simulation. However, the value of the electrical property could also be determined by applying a set of rules to one or more simulation results. Step 348 can include determining a value for more than one electrical property. In addition to determining a value for an electrical property, a value for a property other than an electrical property can be determined. For example, a value for a temperature can be determined.

Step 350 is determining whether the value of the electrical property of the circuit corresponds to a coverage condition within the set of one or more coverage conditions. For example, it is determined whether the voltage at a node is in the voltage range. Step 350 can include determining whether the value of the electrical property and a value for another property are each within the coverage space. For example, step 350 can determine whether a voltage and a temperature are within the coverage space.

If the coverage condition is met then, in Step 352, an indication that the coverage condition has been satisfied is stored. A report that includes whether or not the coverage condition has been satisfied can be provided to the stimulus generator, such that the stimulus generator can automatically generate a new analog stimulus to cover the desired coverage condition.

If the coverage condition was determined to have not been met, then control returns to step 348 to determine another value for the electrical property, if more values are possible. Even if the coverage condition was determined to have been met and an indication of this was stored, control can still return to step 348 to determine another value for the electrical property. This allows determining if multiple points in a coverage space have been hit.

Mixed Analog/Digital Mode

Figure 4:
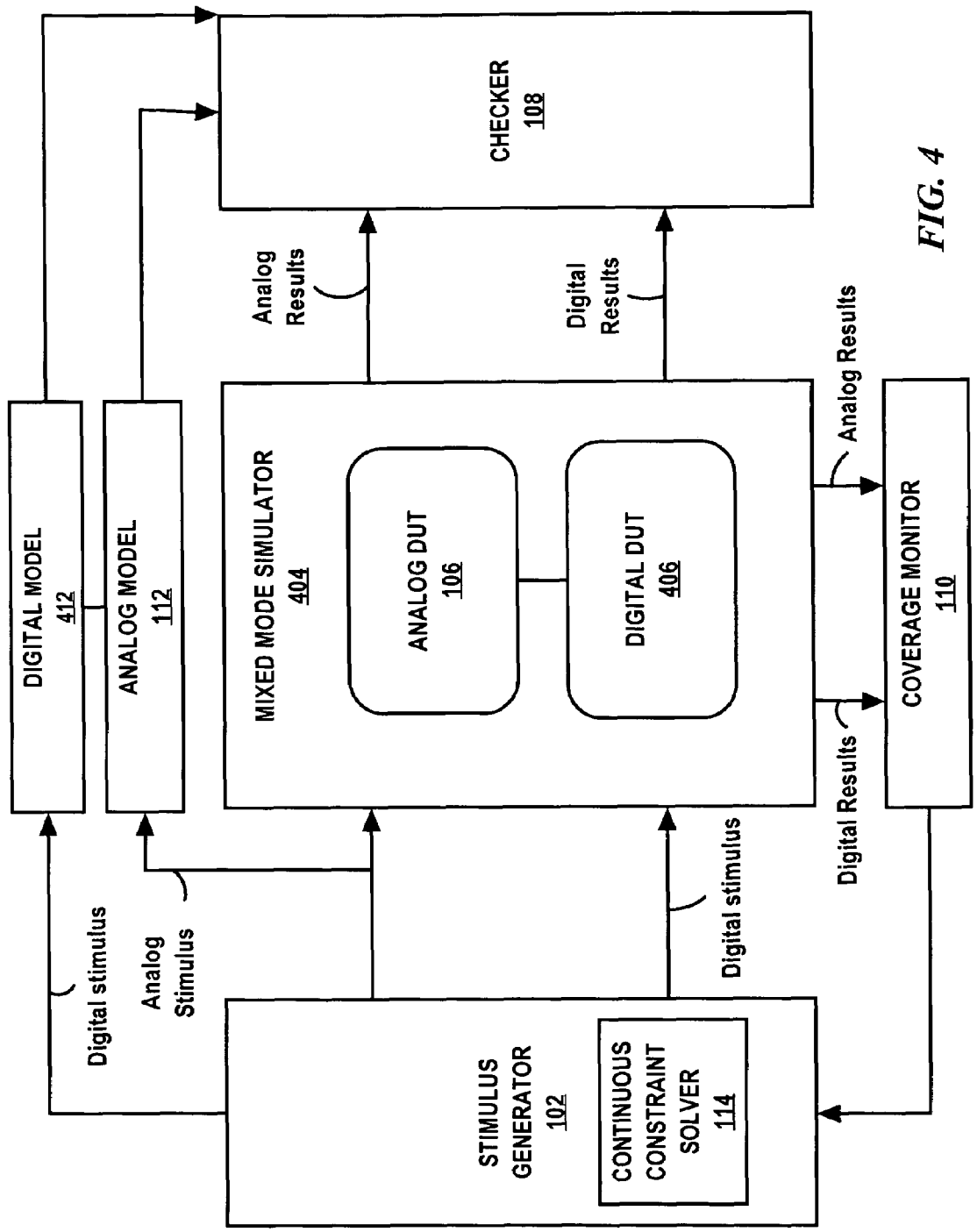
FIG. 4 is an environment for analyzing and verifying a design having an analog portion and a digital portion, in accordance with an embodiment of the present invention.

FIG. 4 is a system overview of an environment for analyzing and verifying a design having an analog portion and a digital portion, in accordance with an embodiment of the present invention. A mixed mode simulator 404 executes a simulation of an analog DUT 106 and a simulation of digital DUT 406. Techniques for mixed mode simulation are known to those of ordinary skill in the art. For example, Verilog-AMS can be used to achieve mixed mode simulation. However, other techniques may be used as well. The analog DUT 106 may be a transistor-level simulation. For example, the simulation of the analog DUT 106 may be based on a variant of the SPICE language. The analog DUT 106 may be simulated at a higher level of abstraction, such as with an HDL. The digital DUT 406 may be simulated with an HDL, such as Verilog or VHDL. However, the digital DUT 406 may be simulated using other languages.

The stimulus generator 102 is able to generate both an analog and a digital stimulus. The digital stimulus is provided to the mixed mode simulator 404 and to the digital model 412. The digital stimulus can be generated with techniques known to those of ordinary skill in the art. For example, existing high level verification languages have the ability to generate a digital stimulus.

The digital model 412 models the digital DUT 406 at a relatively high abstraction level and is able to produce expected simulation results, which are provided to the checker module 108. The checker module 108 is able to check results in both the analog and the digital domain.

The coverage monitor 110 is able to determine coverage in both the analog and the digital domain. A report from the coverage monitor is provided to the stimulus generator 102, wherein the stimulus generator 102 is able to generate both analog and digital stimuli that are tailored to meet coverage conditions. Any of the process flows described herein can be used for analyzing a mixed mode simulation.

Hardware Overview

Figure 5:
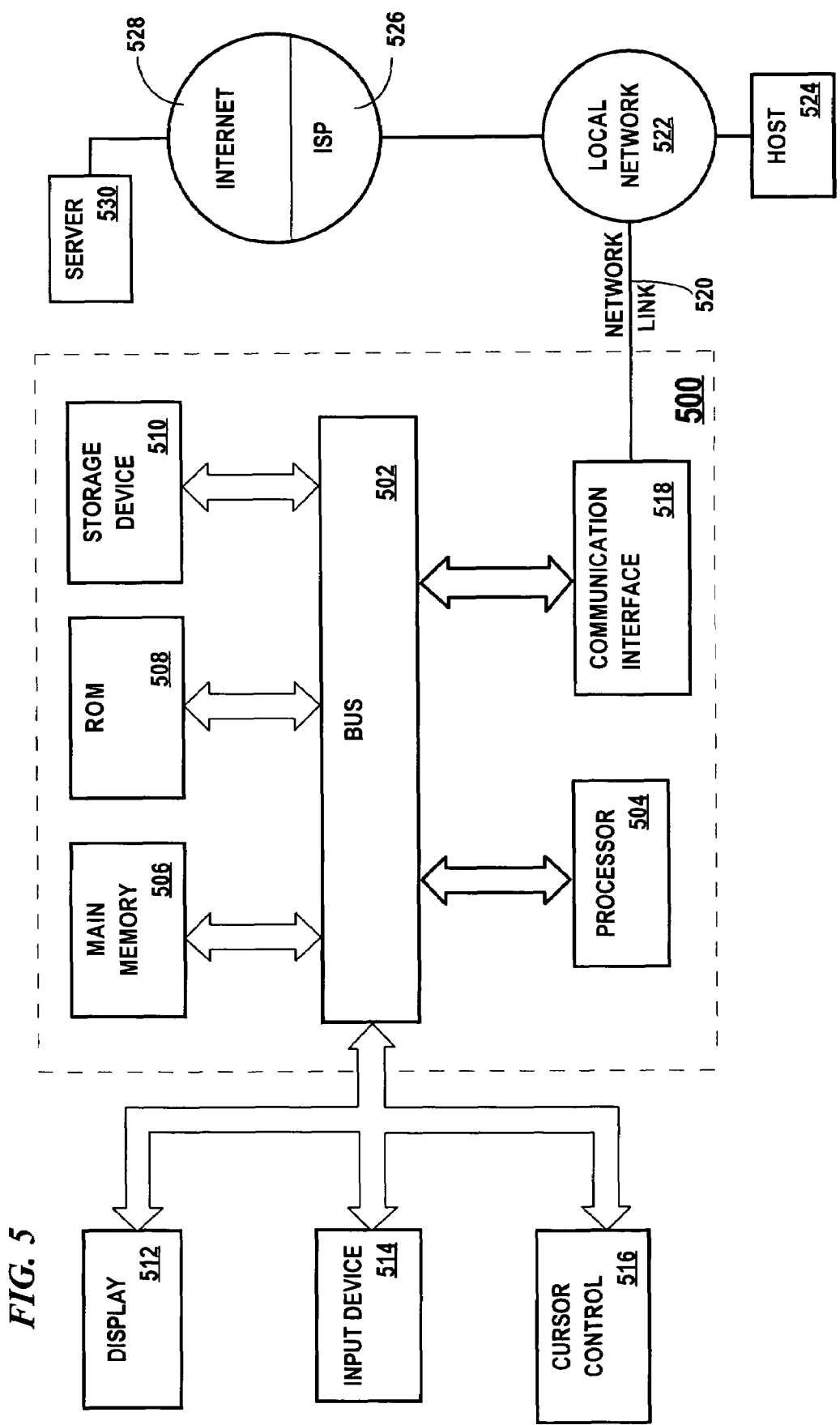
FIG. 5 is a block diagram that illustrates a computer system upon which an embodiment of the invention may be implemented.

FIG. 5 is a block diagram that illustrates a computer system 500 upon which an embodiment of the invention may be implemented. Computer system 500 includes a bus 502 or other communication mechanism for communicating information, and a processor 504 coupled with bus 502 for processing information. Computer system 500 also includes a main memory 506, such as a random access memory (RAM) or other dynamic storage device, coupled to bus 502 for storing information and instructions to be executed by processor 504. Main memory 506 also may be used for storing temporary variables or other intermediate information during execution of instructions to be executed by processor 504. Computer system 500 further includes a read only memory (ROM) 508 or other static storage device coupled to bus 502 for storing static information and instructions for processor 504. A storage device 510, such as a magnetic disk or optical disk, is provided and coupled to bus 502 for storing information and instructions.

Computer system 500 may be coupled via bus 502 to a display 512, such as a cathode ray tube (CRT), for displaying information to a computer user. An input device 514, including alphanumeric and other keys, is coupled to bus 502 for communicating information and command selections to processor 504. Another type of user input device is cursor control 516, such as a mouse, a trackball, or cursor direction keys for communicating direction information and command selections to processor 504 and for controlling cursor movement on display 512. This input device typically has two degrees of freedom in two axes, a first axis (e.g., x) and a second axis (e.g., y), that allows the device to specify positions in a plane.

The invention is related to the use of computer system 500 for implementing the techniques described herein. According to one embodiment of the invention, those techniques are performed by computer system 500 in response to processor 504 executing one or more sequences of one or more instructions contained in main memory 506. Such instructions may be read into main memory 506 from another machine-readable medium, such as storage device 510. Execution of the sequences of instructions contained in main memory 506 causes processor 504 to perform the process steps described herein. In alternative embodiments, hard-wired circuitry may be used in place of or in combination with software instructions to implement the invention. Thus, embodiments of the invention are not limited to any specific combination of hardware circuitry and software.

The term "machine-readable medium" as used herein refers to any medium that participates in providing data that causes a machine to operation in a specific fashion. In an embodiment implemented using computer system 500, various machine-readable media are involved, for example, in providing instructions to processor 504 for execution. Such a medium may take many forms, including but not limited to, non-volatile media, volatile media, and transmission media. Non-volatile media includes, for example, optical or magnetic disks, such as storage device 510. Volatile media includes dynamic memory, such as main memory 506. Transmission media includes coaxial cables, copper wire and fiber optics, including the wires that comprise bus 502. Transmission media can also take the form of acoustic or light waves, such as those generated during radio-wave and infra-red data communications. All such media must be tangible to enable the instructions carried by the media to be detected by a physical mechanism that reads the instructions into a machine.

Common forms of machine-readable media include, for example, a floppy disk, a flexible disk, hard disk, magnetic tape, or any other magnetic medium, a CD-ROM, any other optical medium, punchcards, papertape, any other physical medium with patterns of holes, a RAM, a PROM, and EPROM, a FLASH-EPROM, any other memory chip or cartridge, a carrier wave as described hereinafter, or any other medium from which a computer can read.

Various forms of machine-readable media may be involved in carrying one or more sequences of one or more instructions to processor 504 for execution. For example, the instructions may initially be carried on a magnetic disk of a remote computer. The remote computer can load the instructions into its dynamic memory and send the instructions over a telephone line using a modem. A modem local to computer system 500 can receive the data on the telephone line and use an infra-red transmitter to convert the data to an infra-red signal. An infra-red detector can receive the data carried in the infra-red signal and appropriate circuitry can place the data on bus 502. Bus 502 carries the data to main memory 506, from which processor 504 retrieves and executes the instructions. The instructions received by main memory 506 may optionally be stored on storage device 510 either before or after execution by processor 504.

Computer system 500 also includes a communication interface 518 coupled to bus 502. Communication interface 518 provides a two-way data communication coupling to a network link 520 that is connected to a local network 522. For example, communication interface 518 may be an integrated services digital network (ISDN) card or a modem to provide a data communication connection to a corresponding type of telephone line. As another example, communication interface 518 may be a local area network (LAN) card to provide a data communication connection to a compatible LAN. Wireless links may also be implemented. In any such implementation, communication interface 518 sends and receives electrical, electromagnetic or optical signals that carry digital data streams representing various types of information.

Network link 520 typically provides data communication through one or more networks to other data devices. For example, network link 520 may provide a connection through local network 522 to a host computer 524 or to data equipment operated by an Internet Service Provider (ISP) 526. ISP 526 in turn provides data communication services through the world wide packet data communication network now commonly referred to as the "Internet" 528. Local network 522 and Internet 528 both use electrical, electromagnetic or optical signals that carry digital data streams. The signals through the various networks and the signals on network link 520 and through communication interface 518, which carry the digital data to and from computer system 500, are exemplary forms of carrier waves transporting the information.

Computer system 500 can send messages and receive data, including program code, through the network(s), network link 520 and communication interface 518. In the Internet example, a server 530 might transmit a requested code for an application program through Internet 528, ISP 526, local network 522 and communication interface 518.

The received code may be executed by processor 504 as it is received, and/or stored in storage device 510, or other non-volatile storage for later execution. In this manner, computer system 500 may obtain application code in the form of a carrier wave.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A method comprising performing a machine-executed operation involving instructions, wherein the machine-executed operation is at least one of:
   A) sending the instructions over transmission media;
   B) receiving the instructions over transmission media;
   C) storing the instructions onto a machine-readable storage medium; and
   D) executing the instructions;
   wherein the instructions are instructions which, when executed by one or more processors, cause the one or more processors to perform the steps of:
   executing a verification program;
      wherein the verification program includes a definition of an analog source;
      wherein execution of the verification program generates a stimulus that represents a signal of the analog source;
   applying the stimulus to a simulation of at least a portion of an electronic circuit to generate at least one simulation result;
   providing the at least one simulation result to the verification program; and
   the verification program performing at least one of:
      checking whether the simulation result complies with an expected simulation result;
      checking whether an electrical property, based on the simulation result, has a value that violates a constraint on the electrical property specified in the verification program; and
      determining whether the simulation resulted in occurrence of a specified simulation condition specified in the verification program.

2. The method of claim 1 wherein:
the step of generating a stimulus includes generating a stimulus that has the one or more attributes.

3. The method of claim 2 wherein:
one of the attributes is a range; and
the step of generating a stimulus includes generating a value within the range.

4. The method of claim 3 wherein:
the step of generating a stimulus is repeatedly performed for a series of simulations; and
for each simulation in the series of simulations, a different value within the range is generated for the stimulus.

5. The method of claim 4 wherein the different values are different magnitudes for the stimulus.

6. The method of claim 5 wherein the different values are randomly distributed within the range.

7. The method of claim 2 wherein the analog source is a first analog source and the stimulus is a first stimulus; and wherein:
one of the attributes defines a relationship between the first analog source and a second analog source that is defined in the verification program; and
wherein execution of the verification program generates a second stimulus that represents a signal of the second analog source, wherein the first stimulus and the second stimulus are related to one another as specified by the defined relationship between the first analog source and the second analog source.

8. The method of claim 2 wherein:
one of the attributes identifies a noise; and
the step of generating a stimulus includes generating noise values representing the identified noise and incorporating the noise values into the stimulus.

9. The method of claim 2 wherein:
one of the attributes is at least one bounding constraint; and
the step of generating a stimulus includes solving a constraint problem to determine values to assign to the stimulus.

10. The method of claim 2, wherein:
the set of one or more attributes comprises an attribute that specifies a waveform shape.

11. The method of claim 1 wherein execution of the verification program solves a constraint problem to determine values to assign to the stimulus.

12. The method of claim 1 wherein the execution of the verification program solves a constraint problem based on a plurality of constraints.

13. A method as recited in claim 1, further comprising:
applying the stimulus to a model of at least a portion of the electronic circuit to generate the expected simulation result.

14. A method as recited in claim 1, wherein the expected simulation result comprises a range of values.

15. A method as recited in claim 14, wherein the checking whether the simulation complies with an expected simulation result comprises determining if the at least one simulation result falls within the range of values.

16. A method as recited in claim 1:
wherein the stimulus that represents a signal of an analog source is an analog stimulus and the simulation of at least a portion of the electronic circuit is an analog simulation;
wherein execution of the verification program generates a digital stimulus that represents a signal of a digital source that is defined in the verification program using the high level verification language; and
wherein the instructions cause the one or more processors to perform the further step of applying the digital stimulus to a digital simulation of at least a portion of the electronic circuit to generate at least one simulation result.

17. The method of claim 1, wherein the analog source is a voltage source.

18. The method of claim 1, wherein the analog source is a current source.

19. The method of claim 1, wherein the specified simulation condition is defined in the verification program as a range of values.

20. The method of claim 1, wherein the specified simulation condition is defined in the verification program as a coverage space.

21. The method of claim 1, wherein the specified simulation condition is based on a plurality of parameters.

22. The method of claim 1, wherein the verification program is written in a high level verification language.

23. The method of claim 22, wherein the high level verification language is adapted to:
generate a variety of stimuli to successively apply to a series of simulations of an analog device under test;
monitor simulation results of the series of simulations; and
track what simulation conditions were covered when the variety of stimuli are applied to the series of simulations.

24. A method of simulating a circuit that includes an analog portion, the method including:
executing a verification program;
wherein the verification program includes a definition of a data object;
wherein the definition specifies one or more attributes of the data object;
wherein execution of the verification program causes instantiation of a data structure based on the definition;
wherein the data structure has fields that correspond to the attributes specified by the definition;
during simulation of the circuit, determining a value of an electrical property associated with the analog portion of the circuit; and
performing at least one of:
a) assigning the value of the electrical property to a field of the data structure;
b) reading a value from a field of the data structure to determine a constraint on the value of the electrical property; and
generating an indication of a violation if the value of the electrical property associated with the analog portion violates the constraint; and
c) reading a value from a field of the data structure to determine a set of one or more coverage conditions;
detecting whether the value of the electrical property associated with the analog portion corresponds to a coverage condition within the set of one or more coverage conditions; and
storing an indication that the coverage condition has been satisfied.

25. A method as recited in claim 24, wherein the constraint comprises a range of values and wherein the generating an indication of a violation comprises determining if the value of the electrical property is within the range of values.

26. A method as recited in claim 24, wherein the coverage condition comprises a coverage space and wherein the detecting whether the value of the electrical property of the circuit corresponds to a coverage condition comprises determining if the value of the electrical property is within the coverage space.

27. A method as recited in claim 24, further comprising:
detecting whether the value of the electrical property and another property corresponds to a particular coverage condition within the set of one or more coverage conditions; and
storing an indication that the particular coverage condition has been satisfied.

28. A method as recited in claim 24, wherein the electrical property includes one of: an output voltage swing, output impedance, a rise time, a fall time, a voltage ringing, a phase margin, a voltage gain, a current gain, a power dissipation, a jitter, and a delay.

29. The method of claim 24, wherein the verification program is written in a high level verification language.

30. The method of claim 29, wherein the high level verification language is adapted to:
generate a variety of stimuli to successively apply to a series of simulations of an analog device under test;
monitor simulation results of the series of simulations; and
track what simulation conditions were covered when the variety of stimuli are applied to the series of simulations.

31. A method as recited in claim 24, wherein the data object is a monitoring data object.

32. A method as recited in claim 24, wherein the data object is one of a monitoring data object, an event detection data object, and a coverage data object.

* * * * *